United States Patent [19]

Blomquist

[11] Patent Number: 5,208,731

[45] Date of Patent: May 4, 1993

[54] HEAT DISSIPATING ASSEMBLY

[75] Inventor: Michael L. Blomquist, Newbury Park, Calif.

[73] Assignee: International Electronic Research Corporation, Burbank, Calif.

[21] Appl. No.: 822,432

[22] Filed: Jan. 17, 1992

[51] Int. Cl.[5] .............................................. H05K 7/20
[52] U.S. Cl. .................................. 361/386; 174/16.3; 361/388; 257/718
[58] Field of Search ............................ 165/80.3, 185; 174/16.3; 267/150, 160; 357/79, 81; 361/383, 386–389

[56] References Cited

U.S. PATENT DOCUMENTS 4,716,494 12/1987 Bright et al. .......................... 361/386
4,660,1223 4/1987 Hermann ............................. 174/16.3

OTHER PUBLICATIONS

IERC "High Speed Microprocessor Heat Dissipators" Bulletin No. 503, Mar. 1991 pp. 1-2.
Almquist et al, "Spring-Clip Mounted Extruded Aluminum Heat Sink" IBM Tech. Disc. Bulletin, vol. 23, No. 12, May 1981, p. 1.

Primary Examiner—Gregory D. Thompson
Attorney, Agent, or Firm—Bruce A. Jagger

[57] ABSTRACT

This invention provides an improved system for removably coupling a conductive heat sink to a chip housing. The heat sink is of the type having a plurality of pins arrayed in a grid pattern and extending perpendicularly from the top surface of a generally square base. The chip housing is of the type having opposite side walls each having latching projections. The heat sink is positioned in conductive thermal communication with an exposed portion of a computer chip or other device which is securely mounted to the housing. A flexible and resilient spring clip is adapted to fit within the passages defined by the spaces between the pins on the heat sink. The flexibility of the spring clip allows portions along opposing walls of the spring clip to be stretched and guided over the latching projections. The resiliency of the spring clip provides a spring bias sufficient to retain the heat sink in conductive thermal communication with the chip element under required working conditions. The resilient forces of the stretched spring clip are not so great as to prevent the quick and easy manual insertion and removal of the spring clip.

13 Claims, 2 Drawing Sheets

HEAT DISSIPATING ASSEMBLY

FIELD OF THE INVENTION

The present invention relates generally to an assembly which provides for the dissipation of heat from an conventional active electronic device such as an electronic chip or an electronic package, and, more particularly, to a spring clip for coupling a heat sink to a housing or socket such that the heat sink is maintained in heat conducting communication with the electronic device or package when that device is securely mounted to the housing.

BACKGROUND OF THE INVENTION

An electronic device such as a computer chip can be ruined if exposed to excessive heat. Several heat dissipating systems have been used to eliminate the heat which is necessarily generated in any integrated circuitry. Forced air convection is one method of heat dissipation which has proven to be effective but expensive and of limited application. An alternative method which is well known in the industry is the placement of a heat sink in heat conducting communication with the chip.

A heat sink is a device which preferably has a relatively high rate of thermal conductivity and a high heat capacity. Because of its material properties and design a heat sink is adapted to draw heat from any closely situated heat source and dissipate that heat into the surrounding environment. Conductive heat sinks are designed in various shapes and sizes, and are adapted to conform to the shape of an exposed surface of the electronic device or chip, from which heat is to be dissipated.

One type of heat sink, as shown, for example, in Hinshaw U.S. Pat. Nos. 4,884,331, and 4,879,891, provides a generally rectangular base portion with integrally formed pins or fins rising perpendicularly from the top surface of the base portion. The pins are arranged in a grid array over the entire top surface of the base portion. This heat sink has a generally flat bottom surface adapted to contact the flat exposed surface of a chip element mounted on a socket or housing.

The heat sink must be retained in conductive thermal communication with the chip during normal heating and cooling cycles as well as under substantial acceleration forces induced by shock and vibration. The problem of providing an assembly with a satisfactory retention system can be readily seen in prior expedients. See, for example, Bright et al. U.S. Pat. No. 4,716,494. It has been found that heat sinks should not be bonded or otherwise permanently secured directly to the computer chip because the different rates of thermal expansion cause the bond or even the computer chip to break. Also, removal and replacement becomes difficult and time consuming. Similarly, the heat sink should not be bonded, or otherwise permanently secured, to the chip-holding socket for similar reasons. It is easier to service a faulty chip element when access to that chip element is easily gained.

For these and other reasons, a satisfactory assembly preferably includes a retention element which removably secures the sink to the chip-holding socket. Furthermore, the retainer element itself is preferably removably secured to the socket.

Industry standards require any such assembly to dissipate minimum levels of heat and to withstand substantial shock and vibration induced loads without unintended disassembly. A successful retainer element should enhance, or at least not interfere with, the ability of the heat sink to dissipate a sufficient amount of heat to maintain the computer chip in functioning order.

Any retention system which provides for the quick and easy installation and removal of the heat sink to and from the chip-holding socket would necessarily lower the difficulty, time and expense involved in assembling and servicing and, therefore, would be beneficial. The ease of installation and removal would be enhanced by any system which would not require complicated tools, and special skills, machines or tooling.

SUMMARY OF THE INVENTION

This invention is an assembly which provides for the conductive dissipation of heat from an active conventional active electronic device, for example, a computer chip or package. The assembly comprises the device to be cooled, a socket or housing for the device, a heat sink, and a specially configured retainer element or spring clip adapted to removably secure the heat sink to the socket in a thermally conductive position with the device so as to dissipate heat generated in the device.

The conventional electronic devices which this invention serves to protect are adapted to be mounted on and secured to sockets or housings. The sockets are generally configured to receive the devices and connect them to the rest of the circuitry in an electronic manufacture. The mounted device includes an exposed surface which is available for conductive thermal contact with the heat sink. Opposing sides of the socket are each provided with at least one latching element which is designed to function in conjunction with a mating second latching element on the retainer element.

The heat sink member which is used in this assembly has a first surface which is generally adapted to conform to the exposed surface of the computer chip. In its assembled position, this first surface of the heat sink member is positioned against the electronic device and is thereby able to conduct heat from the device. The heat sink has a second surface which includes outwardly projecting heat dissipating members or pins. These pins are arranged in a pattern which generally defines a plurality of first and second channels. The first channels are generally perpendicular to the second channels. The channels are preferably of equal length and depth. A convenient method of creating these perpendicular channels is to arrange the pins in a rectangular grid pattern. The several pins in such a pattern provide the large amount of surface area which is favorable for the radiant dissipation of heat from the heat sink. The retainer element is uniquely configured to be removably received and retained within these channels.

The retainer element, or spring-clip, includes side panels portions which depend from and are integrally formed with respective opposite ends of a plurality of intermediate spring element or strands. These spring elements are adapted to be received in and extend the length of the first channels and includes loops which serve to provide the necessary resiliency and flexibility.

Each of the side panel portions has at least one latching element which is adapted to latch with a respective one of the latching elements on the socket when the retainer element is assembled to the socket. Any of a number of latching configurations may be employed to mate the socket's latching element to the side panel's latching element. Whichever configuration is employed, the latching element will mate or engage with one another through respective engaging parts to couple the retainer element to the socket such that the respective latching elements are substantially fixed with respect to one another.

The assembly is improved by providing a retainer element which is adapted to be resiliently clamped to the socket. When not assembled to the socket, the retainer element is in a relaxed condition. In its relaxed and unassembled condition, the distance between the side panel portions is less than the distance between respective opposing sides of the socket. In order to assemble the retainer element onto the socket, the side panel portions must be further separated by flexing the spring elements sufficiently to accommodate the distance between opposing sides of the socket. When the retainer element is thereby assembled, the bias of the spring elements provide a resilient force having a normally horizontal component which clamps the panel portions against the sides of the socket. This resilient clamping assists in maintain the retainer element in its assembled configuration.

The resilient clamp force also preferably includes a normally vertical component. This vertical component is similarly created by the spring elements having a bias in their assembled configuration tending to force the retainer element into its relaxed configuration. In a preferred embodiment, a portion of the spring elements extend through the first channels and contact the second surface of the heat sink. The respective latching elements each have engaging parts that are adapted to mate with respective engaging parts on respective mating elements. The distance between the contact portion of the spring elements and the plane defined by the engaging parts of the panel portions when the retainer element is in its unassembled relaxed configuration is less than the distance between the contact portion of the spring elements and the plane defined by the engaging parts of the socket when the socket and heat sink are positioned as in their assembled configuration. In order to be assembled, the distance between the contact portion of the spring elements and the plane defined by the engaging parts of the side panels must be further increased by flexing the spring elements by an amount approximately equal the distance between the contact portion of the spring elements and the engaging parts of the socket. The normally vertical component of the resilient clamp is thereby created by the bias of the spring elements towards their relaxed, unassembled configuration. The contact portions of the spring elements are also thereby resiliently forced against the second surface of the heat sink, while the engaging parts of the panel portions are vertically resiliently forced into interengagement with the mating engaging parts of the socket.

The improvement further preferably includes a cross member which is integrally formed with and intermediate the ends of the spring elements. The cross member is positioned to be received in at least one of the second channels such that the cross member engages the pins which define the second channel at the same time that the spring elements engage the pins which define the first channel. The cross member is preferably closely received in the second channel such that engagement with the defining pins prevents substantial relative longitudinal movement between the spring elements and the heat sink. If the heat sink moves far enough to engage the panel portions it tends to unlatch the latching elements and thus cause the assembly to fall apart. The cross member engages the pins in the second channel and greatly increases the force which is required to move the heat sink towards either of the panel portions. Without this cross member, longitudinal relative movement of the spring elements within the first channel is restricted only by the rigidity of the spring elements and the security of the interengagement of the engaging parts of the panel portions with the engaging parts of the socket. Increasing the spring tension by an amount sufficient to prevent such relative movement increases the weight and expense of the spring and makes it difficult to remove and replace. Increasing the complexity of the latching elements to provide the necessary secure interengagement likewise increases the weight, complexity, expense and difficulty of use of the system.

In a further preferred improvement, the panel portions extend toward the opposing sides of the socket as a shallow angle whereby the panels generally make approximate line contact with the opposing sides in the general location of the latching elements. As previously discussed, each latching element on the panel portions includes an engaging part. The engaging part on one of the latching elements is preferably a sharp edge. The sharp edge may be formed, for example, in the panel portion. The sharp edge is positioned to make contact with and bit into, for example, a surface which forms the engaging part on the latching element of the socket. Relatively light resilient forces are thus required to retain the system in its assembled configuration. The amount of resiliency in the spring elements can thereby be reduced to allow for relatively easier manual flexing and assembly of the retainer element.

In the assembled configuration, if the retainer element is moved relative to the socket along the direction of the first channels, the flexible spring elements will necessarily tend to move or rotate the panel portions about the axis defined by the interengagement of the engaging parts. The preferred line contact between the panel portions and the sides of the socket should be located so that such rotation does not tend to leverage the engaging parts out of engagement with one another. The maximum amount of potential movement or rotation of the panel portions should be considered in designing the angle at which the panel portions extend toward the sides of the socket. The angle should be sufficient to ensure that the contact between the sockets and the panel portions is limited to the approximate line contact that is desirable.

It is preferred that the normally vertical component of the resilient clamping force is between five and ten pounds per square inch.

The retainer element is preferably designed not to impede the convective cooling which is provided by the flow of air around the cooling pins. When such a flow of air is not available cooling takes place through radiation alone. A preferable means of allowing a sufficient amount of air to circulate in and around the cooling pins includes the retainer element being designed such that it does not extend to the top of the cooling pins when assembled. When the retainer element is assembled to the socket, the spring elements preferably rise to a distance from the second surface of the heat sink which is less than the height of the cooling pins.

The improved assembly is further preferably provided with several features which make is easy and quick to assemble and disassemble the invention.

Guiding projections are preferably disposed on the same side of the sockets that contain the latching projections. These guiding projections are adapted to guide the latching elements of the panel portions into latching engagement with the latching elements on the socket.

The second surface of the heat sink is preferably symmetric to allow the heat sink to be assembled in one of preferably two orientations. For instance, if the second surface of the heat sink is square, then the distance between either pair of opposing sides of the second surface is preferably identical and also of a similar, or shorter, length that the distance between the sides of the socket. In this way, the heat sink can be placed into its assembled position in either of two axial directions.

It is further preferable that the length between the side portions is greater than the distance between the opposing ends of the second surface of the heat sink so that the ends of the spring elements extend beyond the ends of the second surface of the heat sink. That portion of the retainer element which does extend beyond the sides of the heat sink are thereby accessible for manipulation at all times during both assembly and disassembly. This also provides some clearance for the movement of the heat sink relative to the socket without unlatching the retainer element.

The first and second channel are further preferably of generally equal widths so that the spring elements and cross member will similarly be adapted to be received within either of the channels. In this way, the retainer element can be positioned within the channels of the heat sink in either of the previously described two orientations.

Also, the latching elements on the socket are preferably provided with a sloping top surface or ramp which facilitates the flexing and separation of the panel portions during assembly. The retainer element, during assembly, may, in this way, be easily pushed down towards the assembled configuration as the panel portions are forced onto the sloping surfaces of the latching elements, and the panel portions are displaced outwardly until the latching elements are in a position to engage one another.

To assist in the removal of the retainer element from the assembly of the present invention, each of the panel portions is preferably provided with an angled foot portion. When the retainer element is assembled, the foot portion of each panel portion cooperates with the side of the socket to define a wedging space which is adapted to receive a simple wedge element therein. The simple wedge element could be any of a variety of small objects which would be able to fit within the wedging space. Since the normally horizontal component of the resilient compression force is relatively weak, the insertion of a wedge element in the wedging space and a small amount of leverage exerted on the wedge element easily overcomes the compression force by which the panel portions are held against the sides of the socket.

While the specification concludes with claims particularly pointed out and distinctly claiming the subject matter which is regarded as the invention, it is believed that the invention, the objects, advantages and features of the invention will be better understood from the following description taken in connection with the accompanying drawings which are provided for the purpose of illustration only and not limitation and in which:

BRIEF DESCRIPTION OF THE DRAWINGS

FIG. 5 is a sectional view taken along lines 5—5 of FIG. 4, showing an enlarged view of the latching connection of the spring clip to the latching projection of the housing.

DETAILED DESCRIPTION OF THE PREFERRED EMBODIMENT

Figure 1:
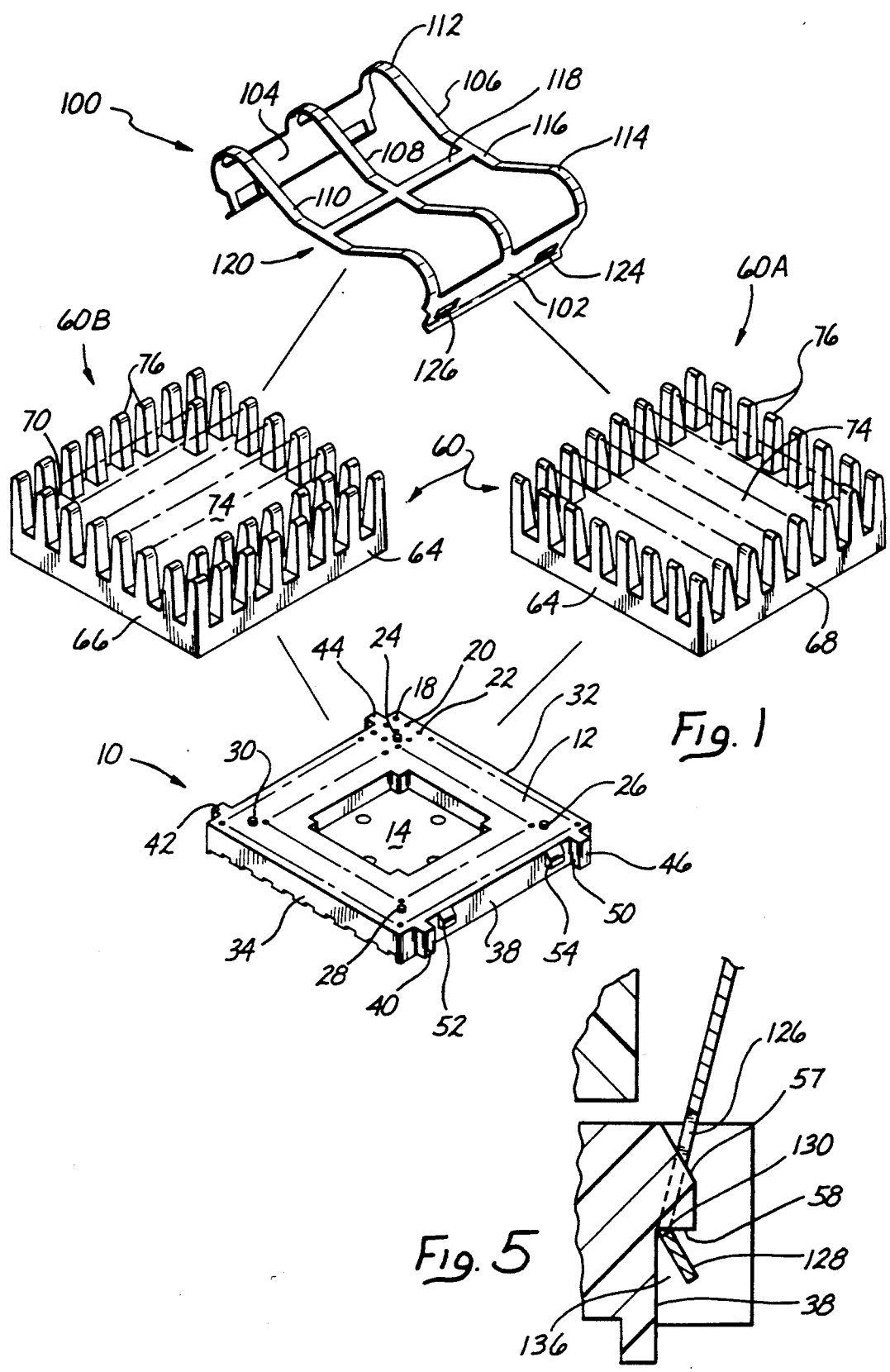
FIG. 1 is an exploded perspective view of the retainer, heat sink and socket system of this invention prior to assembly, with the heat sink being shown twice to illustrate different orientations.
Figure 2:
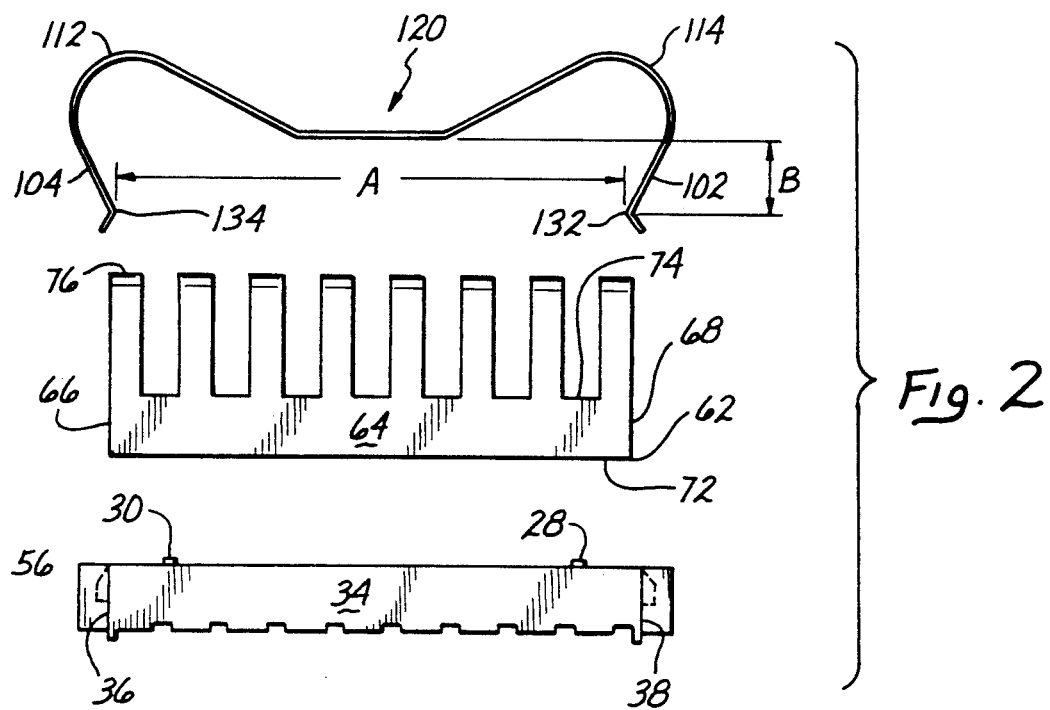
FIG. 2 is an exploded side view of the system of this invention prior to assembly.
Figure 3:
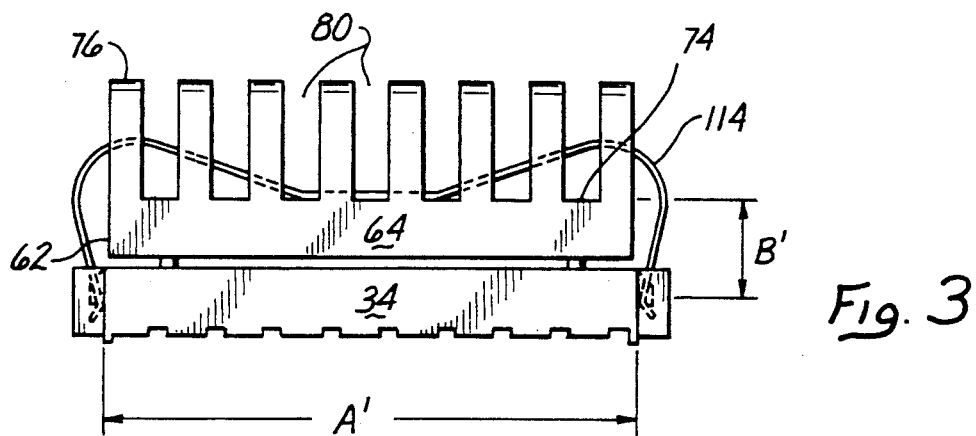
FIG. 3 is similar to the side view shown in FIG. 2 showing the system of this invention after assembly but without the chip.
Figure 4:
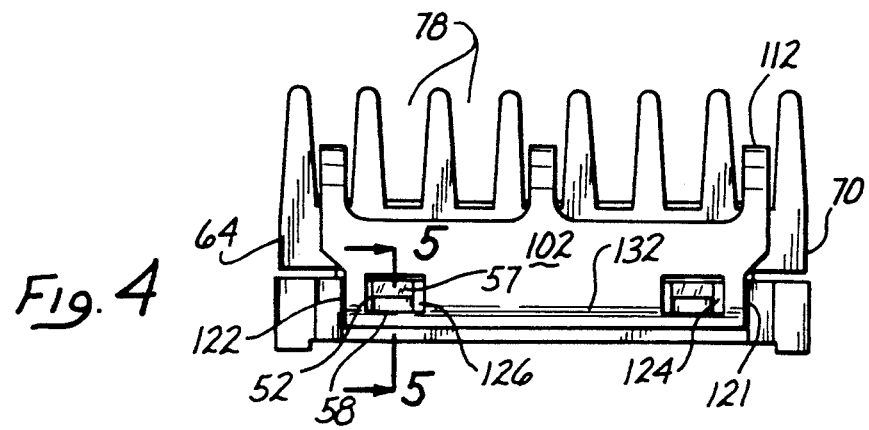
FIG. 4 is an end view of the system of this invention after assembly but without the chip.

The elements of this invention are shown unassembled in FIGS. 1 and 2, and assembled in FIGS. 3 and 4. The assembly includes a chip housing or socket indicated generally at 10, a chip (not shown), a heat sink indicated generally at 60, and a spring clip indicated generally at 100.

Chip housing 10 has a substantially flat top surface 12, including a recessed area 14, onto which an integrated circuit chip (not shown) is mounted.

Surface 12 is provided with a plurality of pin sockets, three of which are shown as pin sockets 18, 20 and 22, arrayed in a grid pattern around the central recess 14. The circuits of the chip (not shown) are electrically and mechanically joined to the circuitry in a printed circuit board (not shown) through electrically conductive pins which are inserted through pin sockets 18, 20 and 22. Top surface 12 is further provided with bosses 24, 26, 28 and 30. As shown in FIGS. 1 through 3, these bosses provide a physical gap between the chip (not shown) and top surface 12 so as to permit a tool to be inserted between the chip and the socket for purposes of removing the chip.

Socket housing 10 has four side walls 32, 34, 36, and 38, which define a square. Opposing side walls 36 and 38 are provided with means which permit spring clip 100 to be removably latched to socket housing 10. Each of side walls 36 and 38 is provided with guiding means which aid in the alignment of the spring clip 100 during assembly of the system. Side wall 38 includes spaced edge guides 40 and 42, and side wall 36 includes edge guides 44 and 46. Each of edge guides 40, 42, 44, and 46 include an inside surface, shown, for example, on edge guide 46 in FIG. 1 as inside surface 50, which collectively are adapted to guide the manually inserted spring clip 100 into proper alignment for interengagement of the latching elements.

The latching elements are provided on each of opposing side walls 36 and 38 by latching projections, two of which are shown on side wall 38 in FIG. 1 as projections 52 and 54. On opposing side wall 36, one of the two latching projections can be seen in outline in FIGS. 2 and 3 as latching projection 56.

Each of the latching projections, represented in FIG. 5 as projection 52, include a sloping top surface ramp 57 and a bottom latching surface 58 which is preferably extended perpendicularly from side wall 38. Each of sloping surfaces 57 allow latching elements on the respective side panels to ride over projection 52 and snap into latching engagement with latching surface 58.

Heat sink 60 is shown in FIG. 1 in a first orientation 60A and in an alternative orientation 60B. The orientation 60A of heat sink 60 with respect to socket housing 10 is shown in FIGS. 2, 3, and 4. The orientation 60B of heat sink 60 is not shown in the other figures. The alternative orientations of 60A and 60B are shown in FIG. 1 to illustrate that it is not necessary to determine a preferred orientation prior to assembling the heat sink 60 to socket 10, as the assembly is designed to allow the heat sink to be oriented in either direction for quick and easy assembly.

Heat sink 60 includes a base portion 62 with side walls 64, 66, 68, and 70. Base portion 62 generally defines a square which is substantially coextensive with the square which is generally defined by the side walls 32, 34, 36 and 38 of socket housing 10. Bottom surface 72 of base portion 62 is substantially planar and adapted generally to conform to the exposed top portion of the chip which is not shown.

The top surface 74 of base portion 62 is provided with a plurality of cooling pins 76 arrayed in a grid pattern over the entire top surface 74. Each cooling pin is preferably integrally formed with, and extends generally perpendicularly from, surface 74.

In a longitudinal direction, the spaces between each row defined by pins 76 is in the form of longitudinal passages or channels 78 extending from side wall 66 to opposing side wall 68. In the perpendicular lateral direction, the space between each row defined by pins 76 defines a lateral passage or channel 80 extending from side wall 64 to side wall 70.

Spring clip 100 is preferably integrally formed from, for example, a single sheet of flexible and resilient 1075 steel with a Rockwell hardness rating of C. Integrally formed spring clip 100 is provided with a calculated amount of flexibility and resiliency by the material and particular design used.

Spring clip 100 has integral side panel portions 102 and 104 depending from parallel extending spaced apart longitudinal relatively narrow strand portions or spring elements 106, 108, and 110. Each spring element 106, 108, and 110 includes two arcuate portions or spring loops 112, 114 which are integrally joined through reverse bends with a generally flat midportion 116. Spring loops 112 and 114 are integrally formed with side panel portions 102 and 104.

The midportions 116 of each of the spring elements 106, 108 and 110 are interconnected by a crossbar strand or member 118. Cross member 118 and midportions 116 lie in a common plane, as best seen in FIGS. 2 and 3 and together define a contact portion 120 which is adapted to contact and bear against top surface 74 of heat sink 60 when the elements of this invention are assembled into a system as shown in FIGS. 3 and 4.

Side panels 102 and 104 each have side edges 121 and 122, FIG. 4, which are provided to cooperate with, for example, edge guides 40, 42, 44 and 46 to allow the side panels 102 and 104 to be guided into latching alignment along opposing side walls 36 and 38.

Holes 124 and 126 are formed in side panels 102 and 104 and are spaced apart by about the same distance as latching projections 52 and 54. Further, each of holes 124, 126 is slightly larger than latching projections 52, 54 so as to permit latching projections 52, 54 to be received within the holes 124 and 126.

A foot 128 is provided on each of side panels 102 and 104 and is angled from the rest of the respective substantially planer side panels 102, 104. The bends in side panels 102 and 104 which forms angled feet 128 are strategically located along the lower edges of rectangular holes 124 and 126 to define a sharp or knife edge 130 along the lower surface of each of holes 124 and 126. This knife edge 130 engages with and bites slightly into engaging part or surface 58 so as to retain the system in an assembled configuration.

The bends 132 and 134 which define the angle between side panels 102, 104 and respective foot members 128 have a small radius and form generally cylindrical surfaces. Bends 132 and 134 generally make line contact with the adjacent parts of socket 10. Sharp edges 130 are generally defined by the perpendicular walls of the normally lower edges of windows or holes 124 and 126. The bends 132 and 134 which define feet 128 serve to turn the sharp edges 130 so that they make line contact with surface 58. The bends preferably approximately coincide with the lower edges of holes 124 and 126.

When spring clip 100 is in its relaxed condition as shown in FIGS. 1 and 2, the distance A between bends 132 and 134 is shorter than the distance between opposing side walls on both heat sink 60 and socket base 10. Therefore, in order to latch the holes 124, 126 of spring clip 100 over latching projections 52, 54 of socket housing 10, side panels 102 and 104 must be stretched apart to accommodate the distance between the side walls of both heat sink 60 and housing 10. After side panels 102, 104 are guided over, for example, latching projections 52 and 54, the outer generally cylindrical surfaces of bends 132 and 134 seat in line contact against opposing side walls 36 and 38 at a distance A' as shown in FIG. 3. Since the assembled spring clip 100 shown in FIG. 3, and particular the loop portions 112 and 114, is stretched, there is a normally horizontal compression force being exerted by side panels 102 and 104 against opposing side walls 36 and 38. This horizontal compression force assists in maintaining the coupling of heat sink 60 and housing 10 against shock and vibration.

Further, in the relaxed configuration of spring clip 100, the distance B between the plane defined by contact portion 120 and the plane defined by bends 132 and 134 is shown in FIG. 2. The distance B' in the assembled configuration, shown in FIG. 3, is considerably larger than the distance B. The distance B' is larger than distance B by more than the thickness of the chip (not shown). Therefore, when the elements of this invention are assembled, a normally vertical compression force or spring bias is exerted by spring clip 100 against the top surface 74 of heat sink 60 towards the housing 10 and also by knife edges 130 against engagement surfaces or parts 58. This normal vertical component combines with the normally horizontal component to aid in maintaining the heat sink 60 coupled to housing 10.

When assembled, the height of arcuate portions or spring loops 112 and 114 preferably do not extend above the pins 76. This allows for airflow between the pins 76 and thereby does not detract from the amount of heat which is dissipated from the heat sink 60, as designed. Also, this provides a low profile assembly which can be utilized in cramped areas.

The ends of arcuate portions 112 and 114 which are integrally formed with side panels 102 and 104, respectively, extend slightly beyond the side walls of heat sink 60. This provides some clearance so that the heat sink may move a short distance relative to the socket without dislodging the interengagement of the spring clip with the socket. It also allows the formation of bends 132 and 134 which provide line contact with socket 10. But for the fact that bends 132 and 134 space the rest of side panels 102 and 104 from walls 36 and 38 so that they is only line contact between the side panels and the socket 10 any movement of loops 112 or 114 would tend to leverage parts 102 and 58 out of engagement. If the bends were spaced by any significant distance from sharp edges 130 the same leveraging effect would be evident.

As shown particularly in FIG. 5, when assembled, the angle of foot 128 with respect to side wall 38 provides a wedging space 136 which is adapted to provide a convenient and easy means by which clip 100 can be removed from the assembly. A simple wedging tool of almost any type which can be inserted within wedging space 136 will serve to overcome the spring bias which maintains the clip 100 coupled to housing 10.

During use the intermeshing of the leaf springs and the cross member of spring clip 100 with the first and second channels 78 and 80 effectively prevents relative movement between the spring clip 100 and the heat sink 60. The electronic device is firmly fixed relative to the socket by the pins which are mounted in pin sockets 18, 20 and 22. The clearance between the side panels 102 and 104 and the heat sink 60, see FIG. 3, permits the heat sink to move relative to the socket 10 and the electronic device without dislodging the latching engagement between the spring clip and the socket. As the heat sink shifts slightly towards the side of the socket which is defined by wall 38 the spring tension in loop spring 114 causes that loop to contract in radius towards its relaxed state. Sharp edge 130 remains biased into contact at the same location with surface 58 as panel 102 tends to roll slightly around bend 132. Spring loop 112 tends to open up so as to increase its radius due to its being pulled by cross member 118. As the loop is forced upon this increases the spring tension on the contact between bend 134 and the mating side wall of the socket. This resists the further movement of heat sink 60 with ever increasing force as loop 112 is forced further open. If the heat sink moves far enough to contact panel 102 there is a risk that it will dislodge the interengagement between sharp edge 130 and surface 58. The normally horizontal component of the spring force provided principally by loop 114 is sufficient to hold sharp edge 130 and surface 58 in engaged relationship until such time as they are forced apart by the movement of the heat sink. This arrangement permits the use of a lightweight spring which can be removed and installed manually while still providing a secure mounting of the heat sink to the device.

The invention is not limited to the embodiments described above, but all changes and modifications thereof, not constituting departures from the spirit and scope of the invention, including reversal, substitution, combination and alteration of parts, are intended to be included.

What is claimed is:

1. An improved heat dissipating assembly of the type including a socket and at least one first latching element disposed on respective opposing sides of said socket, a electronic device, the electronic device being adapted to be mounted to said socket, a heat sink member, and an retainer element, said retainer element being adapted to removably retain said heat sink member in a position to remove heat from the electronic device by conduction, said heat sink member having a first surface generally adapted to conform to an exposed mating surface of the electronic device, said heat sink member including a second surface and a plurality of outwardly projecting heat dissipating members arranged on said second surface so as to define therebetween a plurality of first channels extending generally in a first direction and a plurality of second channels extending generally in a second direction, said second direction being generally perpendicular to said first direction, said first and second channels being of generally equal lengths and depths, said retainer element including side panel portions depending from and integral with respective opposite ends of a plurality of relatively narrow mutually parallel spaced apart spring elements, said spring elements being adapted to hold said panel portions in an unassembled configuration and to be received in and extend along said first channels, each of said side panel portions having at least one second latching element adapted to latch with at least one said first latching element in an assembled configuration; wherein the improvement comprises:

said panel portions being spaced apart in said unassembled configuration by a distance which is less than the distance between said respective opposing sides of said socket, whereby said socket is resiliently clamped between said panel portions in said assembled configuration, cross member means integral with and transverse to each of said spring elements and intermediate said side panel portions, said cross member means lying in a common plane with a midportion of said spring elements and being adapted to be received in at least one of said second channels, whereby the engagement of said cross member means in said least one of said second channels prevents substantial relative longitudinal movement between said spring elements and said heat sink, said panel portions extending toward said opposing sides of said socket at a shallow angle whereby said panel portions generally make approximate line contact with said opposing sides in the general location of said latching elements.

2. The improved assembly of claim 1 wherein each of said first latching elements has a first latching surface adapted to engage a sharp edge disposed on said second latching element when said retainer element is in said assembled configuration.

3. The improved assembly of claim 1 wherein each of said spring elements is adapted to be closely received in a respective one of said first channels, whereby substantial lateral movement between said retainer element and said heat sink member is prevented.

4. The improved assembly of claim 1 wherein at least one of said first and said latching elements includes at least one generally sharp edge adapted to retentively engage a latching surface on the other of said first and second latching elements when said panel portions are in a assembled position, said spring elements adapted to be flexed from an unassembled relaxed condition to an assembled tensioned condition wherein said retainer element retains said heat sink member in a heat conducting position with said electronic device and said sharp edge is spring biased into engagement with said latching surface.

5. The improved assembly of claim 1 wherein the spring tension by which said panel portions are biased against said socket is of such a magnitude that it is easily overcome by an opposing force created manually with a simple wedging tool.

6. The improved assembly of claim 1 further including guiding projections disposed on said respective opposing sides, said guiding projections adapted to guide said first latching elements into latching engagement with said second latching elements as said retainer element is forced into its assembled condition.

7. The improved assembly of claim 1 wherein said spring elements are further adapted to be received in and extend the length of said second channels, whereby said heat sink member is adapted to be assembled in any one of a at least two orientations.

8. The improved assembly of claim 1 wherein said spring elements are longer than the length of said first and second channels, whereby said spring elements extend beyond and out of contact with said heat sink.

9. The improved assembly of claim 1 wherein said first latching elements include sloping surfaces adapted to facilitate the separation of said panel portions during assembly.

10. The improved assembly of claim 1 further including a foot portion integral with and depending from each of said panel portions; each of said foot portions extending away from a respective opposing side of said socket when said retainer element is in its assembled configuration at an angle defining a wedging space; said wedging space adapted to receive a simple wedge element, whereby the wedge element can be inserted in said space and used to disengage said latching elements.

11. An improved heat dissipating assembly for electronic devices of the type including a socket and first latching elements disposed on respective opposing sides of said socket, an electronic device, the electronic device being adapted to be mounted to said socket, a heat sink member, and a retainer element, said retainer element being adapted to removably retain said heat sink member in a position to remove heat from the electronic device by conduction, said heat sink member having a first surface generally adapted to conform to an exposed mating surface of the electronic device, said heat sink member including a second surface and a plurality of outwardly projecting heat dissipating members arranged on said second surface so as to define therebetween a plurality of first channels extending generally in a first direction and a plurality of second channels extending generally in a second direction, said second direction being approximately perpendicular to said first direction, said retainer element including side panel portions depending form and integral with respective opposite ends of a plurality of mutually parallel relatively narrow spaced apart spring elements, said spring elements being adapted to hold said panel portions in an unassembled configuration and to be received in and extend the length of said first channels, each of said side panel portions having a second latching element adapted to latch with a said first latching element in an assembled configuration; wherein the improvement comprises:

cross member means integral with and perpendicular to a midportion of each of said spring elements between said panel portions, said cross member means lying substantially in a common plane with said midportions and being adapted to be received in at least one said second channel, whereby the engagement of said cross member in said second channel prevents substantial relative longitudinal movement between said spring elements and said heat sink.

12. The improved assembly of claim 11 wherein the height to which the heat dissipating members extend normally vertically from said second surface is greater than the height to which the spring elements extend normally vertically from said second surface when said retainer is in said assembled configuration.

13. The improved assembly of claim 11 wherein said spring elements are further adapted to be received in and extend the length of said second channels, whereby said heat sink member is adapted to be assembled in one of a plurality of orientations.

* * * * *